US007919712B2

(12) United States Patent
Mori

(10) Patent No.: US 7,919,712 B2
(45) Date of Patent: Apr. 5, 2011

(54) ELECTRICAL DEVICE WITH STABILIZATION STRUCTURE AND METHOD OF FORMING SAME

(75) Inventor: Kenneth Mori, Los Angeles, CA (US)

(73) Assignee: Belkin International, Inc., Playa Vista, CA (US)

( * ) Notice: Subject to any disclaimer, the term of this patent is extended or adjusted under 35 U.S.C. 154(b) by 1025 days.

(21) Appl. No.: 11/647,990

(22) Filed: Dec. 29, 2006

(65) Prior Publication Data

US 2008/0158833 A1 Jul. 3, 2008

(51) Int. Cl.
*H05K 5/00* (2006.01)
*H02G 3/08* (2006.01)

(52) U.S. Cl. ......... 174/50; 174/17 R; 174/520; 361/728; 361/679.01; 361/752; 312/223.1

(58) Field of Classification Search .................... 174/50, 174/17 R, 19, 21 R, 503, 520, 59, 60, 661, 174/663, 68.1, 260, 72 A, 74 R, 135, 53, 174/57, 58; 439/535, 449, 501, 502, 542, 439/652; 385/134, 135; 361/600, 601, 728, 361/679.01, 679.02; 312/223.1, 223.2, 223.3, 312/223.6; D14/434
See application file for complete search history.

(56) References Cited

U.S. PATENT DOCUMENTS

| | | | | |
|---|---|---|---|---|
| D349,230 | S | 8/1994 | Essick | |
| D365,340 | S | 12/1995 | Hill et al. | |
| D408,012 | S | 4/1999 | Brownlie | |
| 5,984,731 | A | 11/1999 | Laity | |
| D425,866 | S | 5/2000 | Nagasawa et al. | |
| 6,085,925 | A | 7/2000 | Chung | |
| 6,200,159 | B1 * | 3/2001 | Chou | 439/535 |
| 6,321,340 | B1 | 11/2001 | Shin et al. | |
| 6,607,408 | B2 | 8/2003 | Milan | |
| D484,136 | S | 12/2003 | Ivan et al. | |
| 6,697,892 | B1 | 2/2004 | Laity et al. | |
| 6,811,281 | B1 | 11/2004 | Hsiao | |
| 6,967,846 | B2 | 11/2005 | Chen | |
| 6,970,351 | B2 * | 11/2005 | Perez et al. | 312/223.2 |
| 7,223,122 | B2 * | 5/2007 | Mori | 439/501 |
| 7,355,116 | B2 * | 4/2008 | Chen et al. | 174/50 |
| D580,441 | S * | 11/2008 | Mori | D14/434 |
| 7,622,673 | B2 * | 11/2009 | Quijano | 174/50 |
| 7,731,540 | B2 * | 6/2010 | Mori et al. | 439/652 |
| 2003/0216069 | A1 | 11/2003 | Huang | |

OTHER PUBLICATIONS

4x4 USB Peripheral Switch; http://catalog.belkin.com/IWCatProductPage.process?Merchant_Id=&Section_Id=201487&pcount=& Product_Id=157144; 2 pages.

5-Port Network Switch (10/100Mbps); http://catalog.belkin.com/IWCatProductPage.process?Product_Id _113457; 2 pages.

4-Port Cable/DSL Gateway Router http://catalog.belkin.com/IWCatProductPage.process?Product_Id=113464; 1 page.

* cited by examiner

*Primary Examiner* — Angel R Estrada
(74) *Attorney, Agent, or Firm* — Bryan Cave LLP

(57) ABSTRACT

An electrical device (100) having a first side (116) supported by a surface (202) and including: (a) a body (112) having the first side and a second side (117); (b) a stabilization structure (130) adjacent to the body and having at least one opening (134) therein; and (c) an electrical component (102) located at least partially within the body and having one or more first electrical connectors (120) at the second side.

27 Claims, 7 Drawing Sheets

ELECTRICAL DEVICE WITH STABILIZATION STRUCTURE AND METHOD OF FORMING SAME

FIELD OF THE INVENTION

This invention relates generally to electrical devices, and relates more particularly to electrical devices with stabilization structures and methods of forming the same.

BACKGROUND OF THE INVENTION

Light weight plastic cases enclose most electrical components today, and as technology advances, the size and the weight of the electrical devices steadily decrease. But, while the size and the weight of electrical devices have decreased, the size and weight of electrical cables have decreased much more slowly. Thus, the light weight electrical devices coupled to the relatively heavy cables can create problems. For example, when coupling multiple cables to light weight electrical devices, the weight of the cables can cause the electrical device to tip over. That is, one side, surface, or portion of an electrical device becomes elevated above the rest of the device when coupling cables to the device. The increasing popularity of dongles that plug directly into the electrical device magnifies the problem and can cause the electrical device to tip over.

Some electrical devices include extra weight to the bottom of the cases to eliminate this problem. However, consumers generally favor lighter electrical devices, and the extra weight increases the shipping and production costs.

Thus, a need exists for an electrical device that is lightweight but also prevents tipping-over when coupling cables, dongles, and other electrical components to the electrical device.

BRIEF DESCRIPTION OF THE DRAWINGS

The invention will be better understood from a reading of the following detailed description, taken in conjunction with the accompanying figures in the drawings in which.

Figure 1:
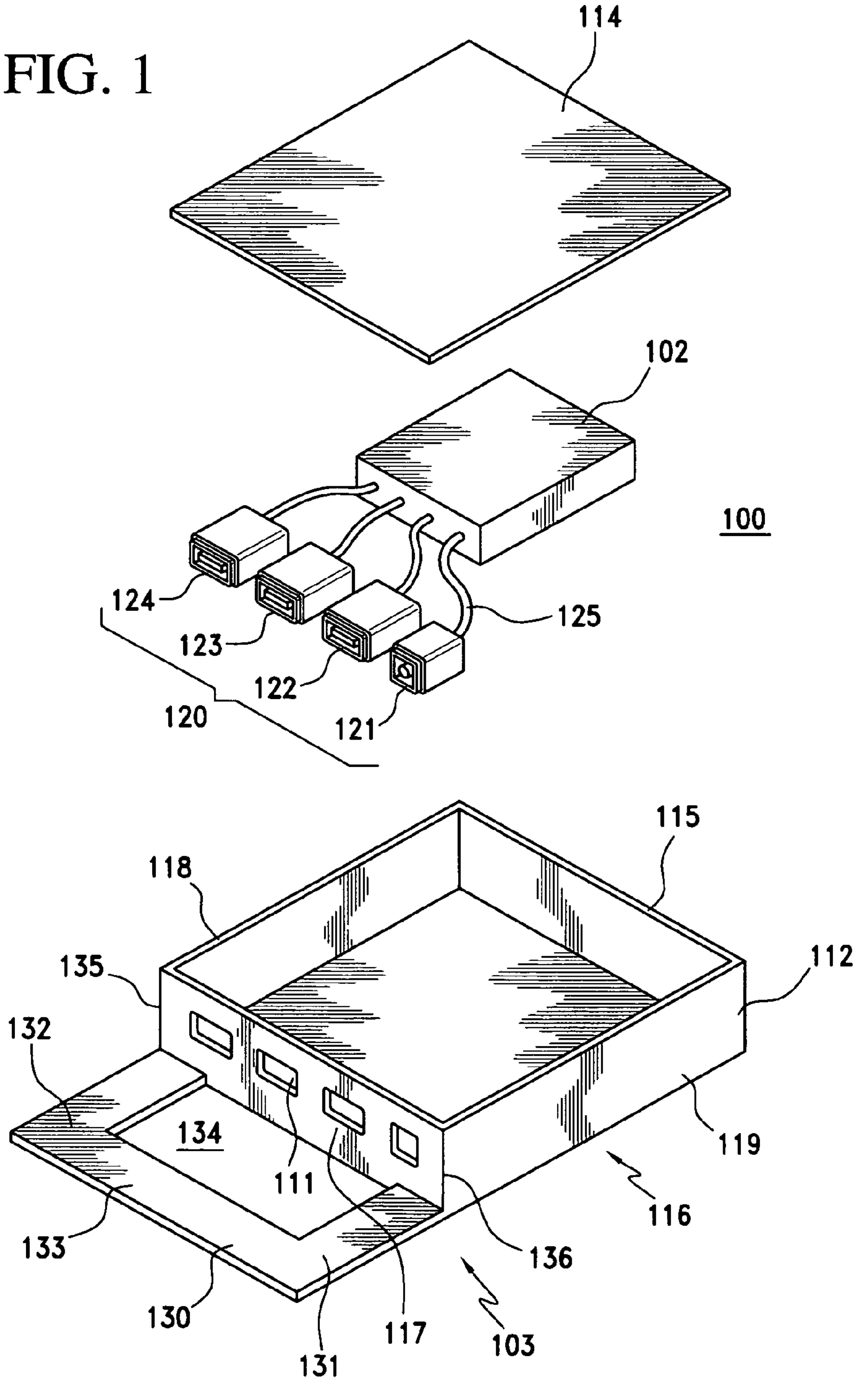
FIG. 1 illustrates an exploded, isometric view of an electrical device according to a first embodiment.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "include," and "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical, mechanical, or other manner.

DETAILED DESCRIPTION OF EXAMPLES OF EMBODIMENTS

In one embodiment, an electrical device has a first side supported by a surface. The electrical device includes: (a) a body having the first side and a second side; (b) a stabilization structure adjacent to the body and having at least one opening therein; and (c) an electrical component located at least partially within the body and having one or more first electrical connectors at the second side. In a different embodiment, the stabilization structure can be replaced a bracing mechanism from a first end of the body to a second end of the body.

In a further embodiment, a method of forming an electrical device includes: (a) providing one or more first electrical components coupled to one or more first electrical connectors; (b) providing a casing comprising: (1) a body having a first side; and (2) a stabilization structure adjacent to the body, and having at least one opening therein; and (c) enclosing at least a portion of the one or more first electrical components and the one or more first electrical connectors in the casing such that the one or more first electrical connectors are accessible at the first side.

Figure 2:
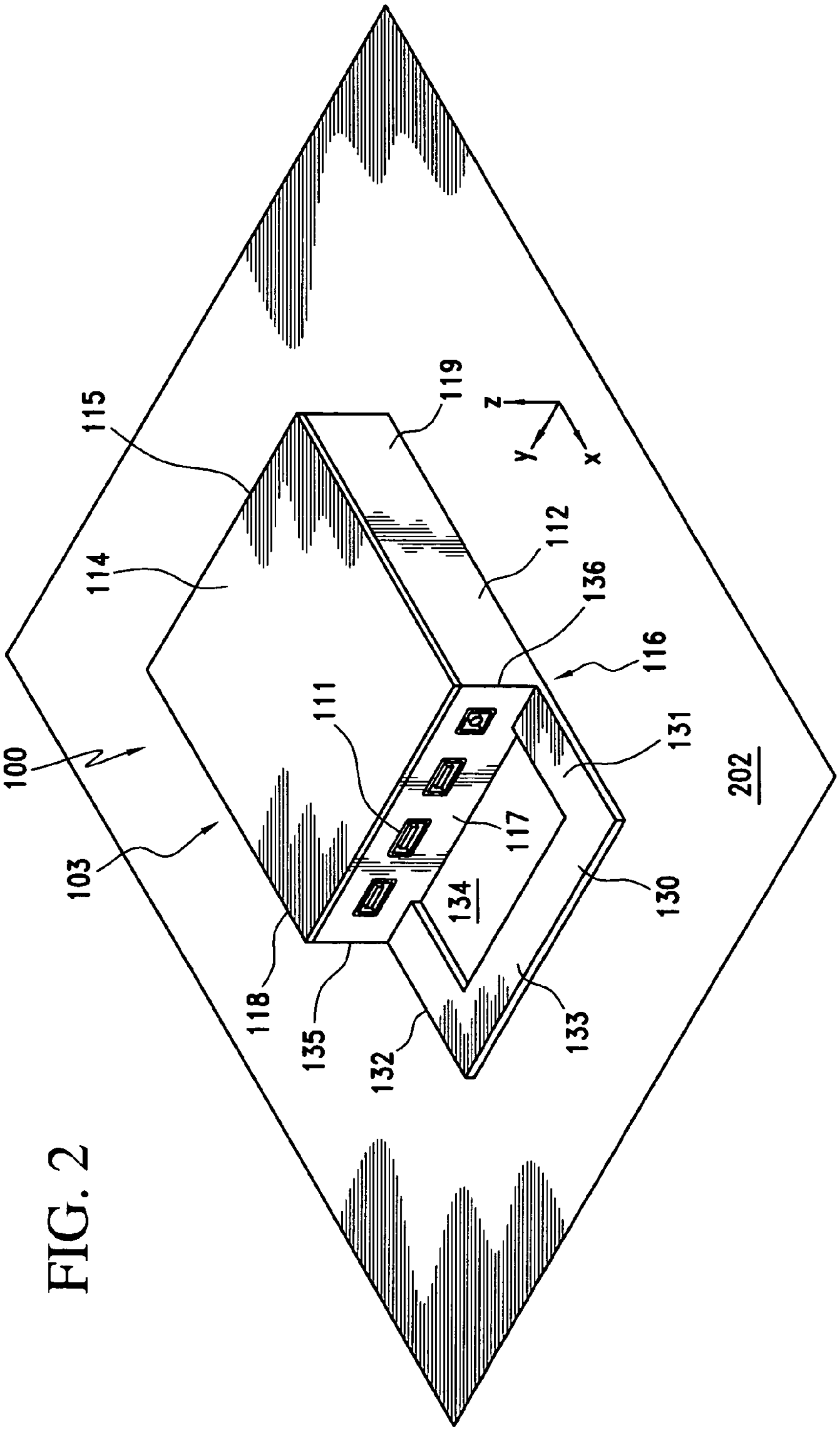
FIG. 2 illustrates a front, right, top isometric view of the device of FIG. 1 on a surface 202, according to the first embodiment.
Figure 3:
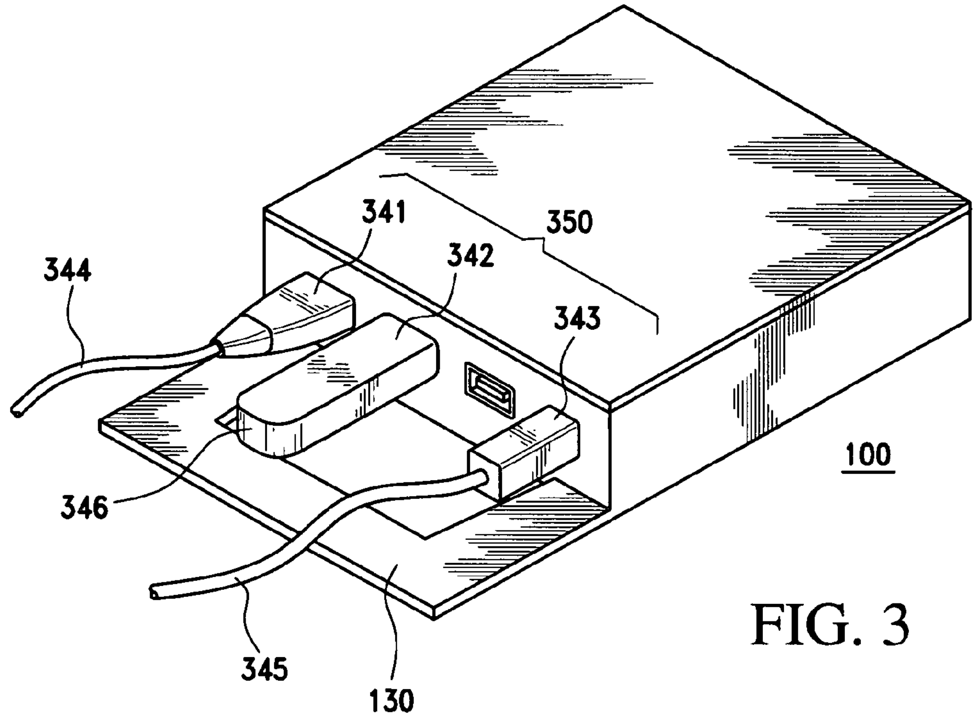
FIG. 3 illustrates a top, front, right isometric view of the device of FIGS. 1 and 2 coupled to electrical connectors, according to the first embodiment.

Turning to the drawings, FIG. 1 illustrates an exploded, isometric view of an electrical device 100, according to a first embodiment. FIG. 2 illustrates a front, right, top isometric view of device 100 on a surface 202, according to the first embodiment. FIG. 3 illustrates a top, front, right isometric view of device 100 coupled to electrical connectors 350, according to the first embodiment. Device 100 is merely exemplary and is not limited to the embodiment presented herein. Device 100 can be employed in many different embodiments not specifically depicted or described herein.

As an example, device 100 can include: (a) a body 112; (b) a stabilization structure 130 adjacent to body 112 and having at least one opening 134 therein; (c) one or more electrical connectors 120 located at least partially within body 112; (d) one or more electrical components 102 located at least partially within body 112; and (e) one or more electrical conductors 125 electrically coupling components 102 to electrical connectors 120. In one embodiment, electrical connectors 120 are capable of being electrically coupled to one or more electrical connectors 350. In one embodiment, body 112 and stabilization structure 130 form a casing 103. In the same or different embodiment, electrical connectors 120 are part of components 102.

In one example, body 112 also includes: (a) a front side 117; (b) a bottom side 116 adjacent to front side 117; (c) a left side 118 adjacent to front side 117 and bottom side 116; (d) a right side 119 adjacent to front side 117 and bottom side 116 and opposite left side 118; (e) a rear side 115 opposite to front side 117 and adjacent to left side 118, right side 119, and bottom side 116; and (f) a top side 114 adjacent to left side 118, right side 119, front side 117, and rear side 115 and opposite bottom side 116. In the example illustrated in FIGS. 1-3, body 112 has a rectangular shape. In alternative embodiments, body 112 can have a circular, square, or another polygonal shape. In still others embodiments, body 112 can have an irregular shape. In one example, a lid of body 112 and casing 103 forms top side 114.

In one embodiment, front side 117 has one or more apertures 111 and includes a first end 135 and a second end 136 opposite to first end 135. In an example, first end 135 is adjacent to left side 118, and second end 136 is adjacent to right side 119. In some embodiments, surface 202 can support bottom side 116. Examples of surface 202 include desktops and tabletops.

In an embodiment, stabilization structure 130 keeps device 100 in a substantially fixed position relative to surface 202 while electrical connectors 350 are electrically coupled to electrical connectors 120 and while electrical connectors 350 are uncoupled from electrical connectors 120. A "substantially fixed position relative to surface 202" means, as used herein, being substantially fixed in the z direction and not necessarily fixed in the x-y plane, as defined in FIG. 2.

As an example, stabilization structure 130 can prohibit rear side 115 from moving away from surface 202 when electrical connectors 350 are electrically coupled to electrical connectors 120. In the same or a different embodiment, a first distance is defined as a distance between rear side 115 and surface 202, and a second distance is defined as a distance between front side 117 and surface 202. In this embodiment, stabilization structure 130 prevents a substantial change in the first distance relative to the second distance when at least one of electrical connectors 350 is coupled to at least one of electrical connectors 120.

In one embodiment, stabilization structure 130 can include one or more support elements extending outward from front side 117. In some examples, the support elements can be referred to as support bars. In the example illustrated in FIGS. 1-3, stabilization structure 130 includes a support element 132 extending outward from first end 135 and a support element 131 extending outward from second end 136. In some examples, support element 131 and support element 132 are separated by an opening 134. In alternative examples, support elements 132 and 131 extend from front side 117 but do not extend outward from first end 135 and second end 136, respectively.

In some embodiments, at least one cross bar 133 can couple together distal ends of support elements 131 and 132. In some examples, a cross bar can be referred to as a support element. In the example shown in FIGS. 1-3, cross bar 133 extends across the entire width of front side 117. In alternative embodiments, support elements 131 and 132 are not coupled together by cross bar 133, and/or cross bar 133 does not extend across the entire width of front side 117. Furthermore, in some embodiments, one or more gripping or high friction elements are coupled to a bottom side of stabilization structure 130.

Components 102 can include electrical circuitry for one or more electrical devices, systems, or components. In one example, components 102 include circuitry for a USB (universal serial bus) hub. In other embodiments, components 102 includes electronics for other electrical devices, such as a router, a digital music player, a telephone, a power source, a power conditioner, a surge protector, a computer, a switch, a modem, a wireless access point, a printer, a monitor, a fax machine, or a data storage device. The design and the manufacturing process for USB hubs and other electrical components are well-know in the art and will not be described herein.

Conductors 125 can be wires, conductive material deposited on a semiconductor device, or any other type of material capable of electrically coupling components 102 and electrical connectors 120. "Conductors" used herein, can refer to a single conductor or two or more conductors, depending on the number of conductors used to electrically couple components 102 and electrical connectors 120.

In one embodiment, electrical connectors 120 include four electrical connectors 121, 122, 123, and 124. In the same or different embodiment, electrical connectors 120 include one or more USB connectors and at least one power connector. In one example, electrical connector 121 is a power connector, and electrical connectors 122, 123, and 124 are USB connectors. In other embodiments, electrical connectors 120 can be serial, parallel, FireWire, or any other type of connectors.

Electrical connectors 120 are capable of electrically coupling device 100 to one or more second electrical devices, components, or systems. The second electrical devices can be similar to or different from device 100.

In the embodiment shown in FIG. 3, the second electrical devices can electrically couple to electrical connectors 120 (FIG. 1) through electrical connectors 350. In the example shown in FIG. 3, electrical connectors 350 include electrical connectors 341, 342, and 343. In some embodiments, cable portions 344 and 345 are coupled to electrical connectors 341 and 343, respectively. In alternative embodiments, electrical connectors 350 include cable portions 344 and 345.

Electrical connector 121 (FIG. 1) is coupled to electrical connector 343, and electrical connector 343 is coupled to a power supply (not shown) through cable portion 345. The power supply can supply direct current (DC) or alternating current (AC). In this example, the power to operate components 102 (FIG. 1) is provided through electrical connector 121. In a different example, components 102 (FIG. 1) can receive power through one of the USB connectors or other dual use connectors. In the same or different embodiment, electrical connector 123 (FIG. 1) can be coupled to electrical connector 341. In one example, electrical connector 341 is coupled to a computer (not shown) through cable portion 344.

Also, in the embodiment illustrated in FIG. 3, electrical connector 123 (FIG. 1) is coupled to electrical connector 342, and electrical connector 342 is a portion of a second electrical device 346. In this example, device 346 is a dongle. A dongle is a small electrical device that includes an electrical connector. Examples of dongles include flash memory drives, digital music players, and small Bluetooth antennas.

Stabilization structure 130 extends away from body 112 in substantially the same or a similar direction as electrical connectors 350. Accordingly, when one or more of electrical connectors 120 are coupled to electrical connectors 350, the combined center of mass of device 100 and electrical connectors 341, 342, and 343 can remain over a footprint of device 100. In the same or a different embodiment, cable portions 344 and 345 are supported by stabilization structure 130. The weight of cable portions 344 and 345 on stabilization structure 130 can help hold stabilization structure 130 in a substantially fixed position relative to surface 202.

In the embodiment shown in FIGS. 1-3, each of electrical connectors 121, 122, 123, and 124 are accessible or protrude from one of apertures 111. In this example, electrical connectors 120 are female connectors and electrical connectors 350 are male connectors. In an alternative embodiment, electrical connectors 120 can be male and/or female connectors, and electrical connectors 350 can be complementary connectors. In some embodiments, the number of apertures 111 is equal to the number of electrical connectors 120. In alternative embodiments, electrical connectors 120 can protrude from a single aperture with a screen covering the space between electrical connectors 121, 122, 123, and 124.

Casing 103 is preferably made of a material that is tough, hard, and rigid, has good chemical resistance and dimensional stability, exhibits good creep resistance, and is relatively strong and inexpensive. Accordingly, casing 103 can be constructed of acrylonitrile butadiene styrene (ABS), polycarbonate, polypropylene, polyethylene, or a similar material, all of which, to varying degrees, exhibit the stated properties. In one embodiment, casing 103 is made using an injection molding process. Injection molding processes for creating plastic casings are well-known in the art and will not be described herein. In alternative embodiment, different materials can be used to form body 112 and stabilization structure 130. For example, body 112 can be made of ABS and stabilization structure 130 can be made of a metal.

Figure 4:
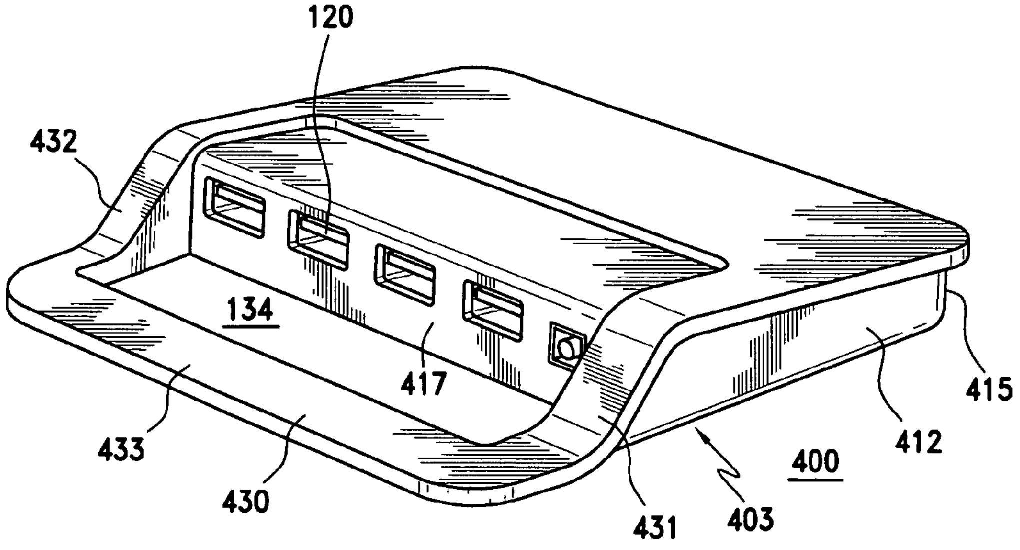
FIG. 4 illustrates a front, right, top isometric view of a second electrical device, according to a second embodiment.

FIG. 4 illustrates a front, right, top isometric view of an electrical device 400, according to a second embodiment. Device 400 includes a body 412 and a stabilization structure 430 adjacent to body 412. Body 412 has a front side 417 and a rear side 415. In this embodiment, the height of body 412 at front side 417 is greater than the height of body 412 at rear side 415. Stabilization structure 430 includes two support elements 431 and 432 and a cross bar 433. In this embodiment, stabilization structure 430 is integrally formed with a portion of body 412 and improves the stability of device 400. In one embodiment, body 412 and stabilization structure 430 form a casing 403.

Figure 5:
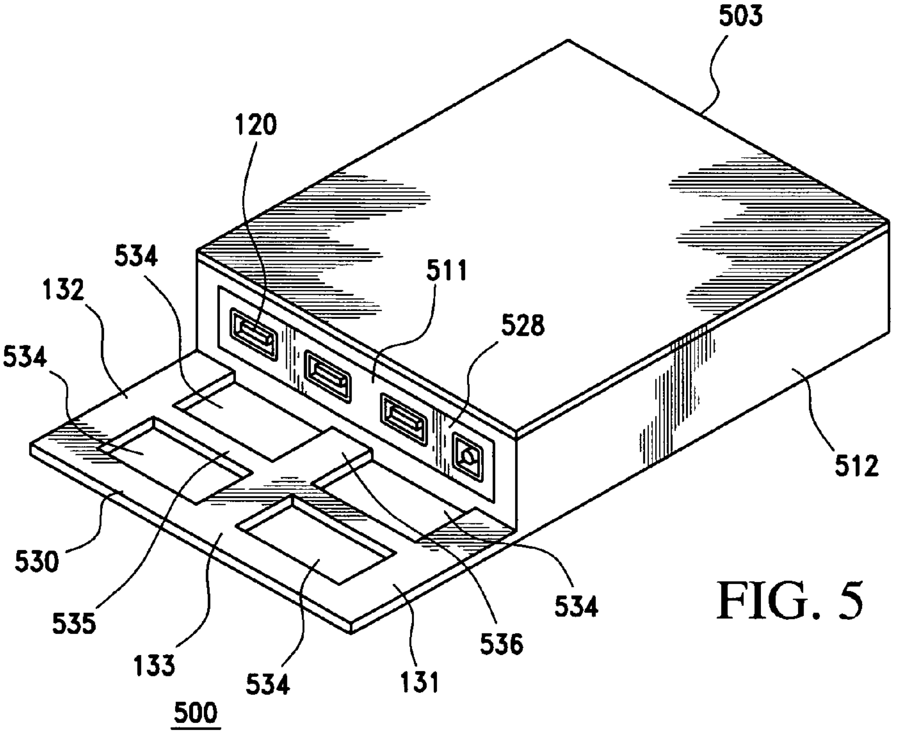
FIG. 5 illustrates a front, right, top isometric view of a third electrical device, according to a third embodiment.

FIG. 5 illustrates a front, right, top isometric view of an electrical device 500, according to a third embodiment. In this embodiment, device 500 includes a body 512 and a stabilization structure 530 adjacent to body 512. Stabilization structure 530 includes support elements 131, 132, and 536 and cross bars 133 and 535. Stabilization structure 530 also has openings 534 therein. The use of support elements 131, 132, and 536 and cross bars 133 and 535 provide increased stability to device 500. Moreover, body 512 includes a single aperture 511 with electrical connectors 120 accessible through aperture 511. A screen 528 covers the portions of aperture 511 between electrical connectors 120. In one embodiment, body 512 and stabilization structure 530 form a casing 503.

Figure 6:
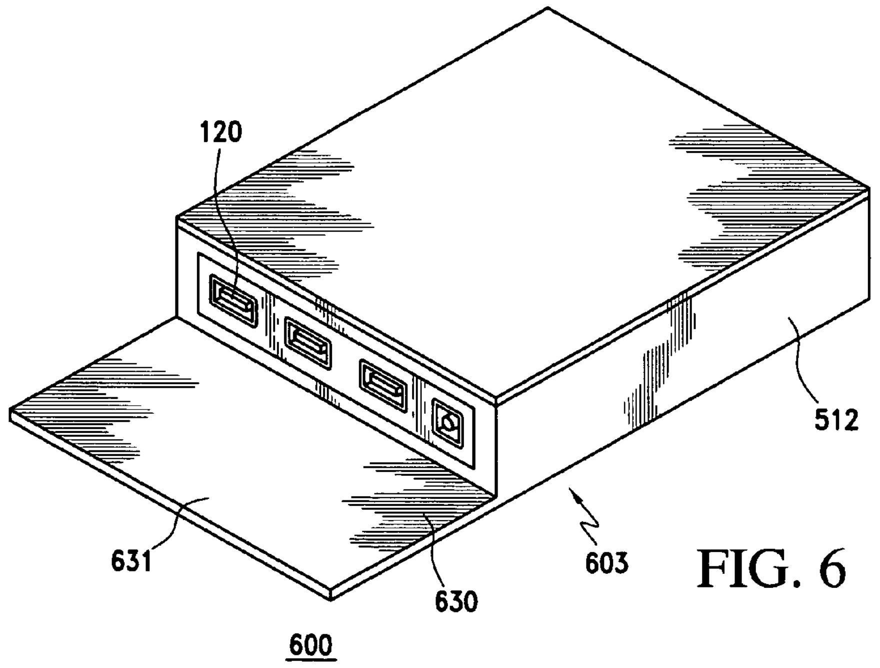
FIG. 6 illustrates a front, right, top isometric view of a fourth electrical device, according to a fourth embodiment.

FIG. 6 illustrates a front, right, top isometric view of an electrical device 600, according to a fourth embodiment. Device 600 includes a body 512 and a stabilization structure 630 adjacent to a body 512. In one embodiment, stabilization structure 630 extends the width of casing 603 and includes a support element 631 that is continuous and devoid of any apertures. In one embodiment, body 512 and stabilization structure 630 form a casing 603.

Figure 7:
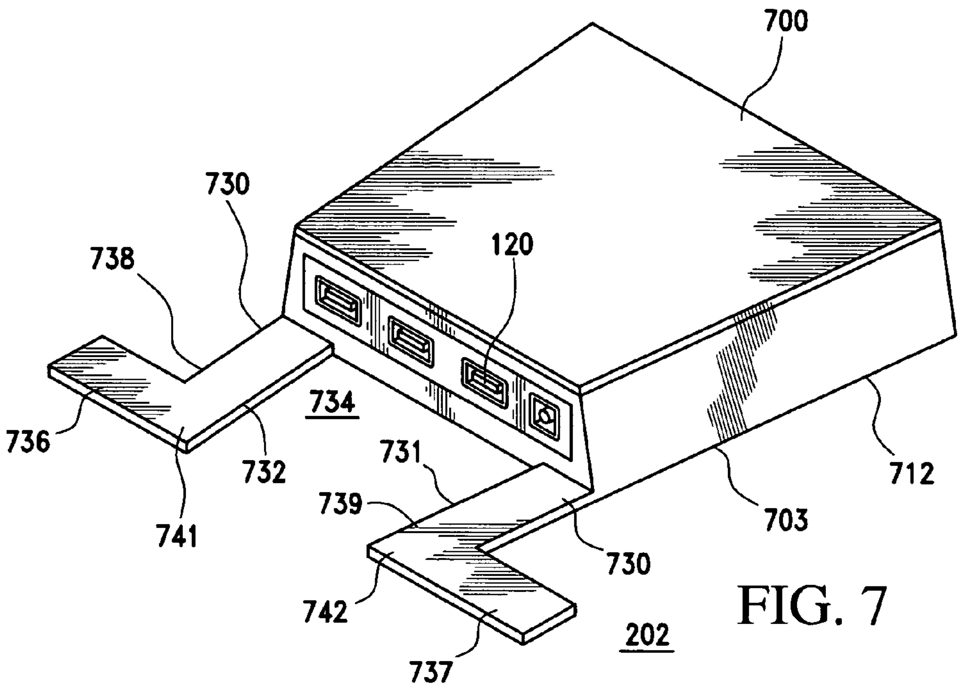
FIG. 7 illustrates a front, right, top isometric view of a fifth electrical device, according to a fifth embodiment.

FIG. 7 illustrates a front, right, top isometric view of an electrical device 700 according to a fifth embodiment. In this embodiment, device 700 includes a body 712 and a stabilization structure 730 adjacent to body 712. In this embodiment, body 712 is similar to body 512 (FIG. 5) except body 712 is trapezoidal in shape. Stabilization structure 730 includes support elements 731 and 732. Support element 731 has a first bracing portion 737 and a second bracing portion 739. Likewise, support element 732 has a first bracing portion 736 and a second bracing portion 738. Second bracing portions 738 and 739 have ends 741 and 742, respectively. In one example, second bracing portions 738 and 739 are similar or identical to support elements 132 and 131 (FIG. 1), respectively. Second bracing portions 739 and 738 are coupled to first bracing portions 737 and 736 at ends 742 and 741, respectively. In this example, first bracing portions 736 and 737 extend away from the center of body 712 in substantially opposite directions. In this embodiment, the region between second bracing portions 738 and 739 form an opening 734 in stabilization structure 730. In one embodiment, body 712 and stabilization structure 730 form a casing 703.

Figure 8:
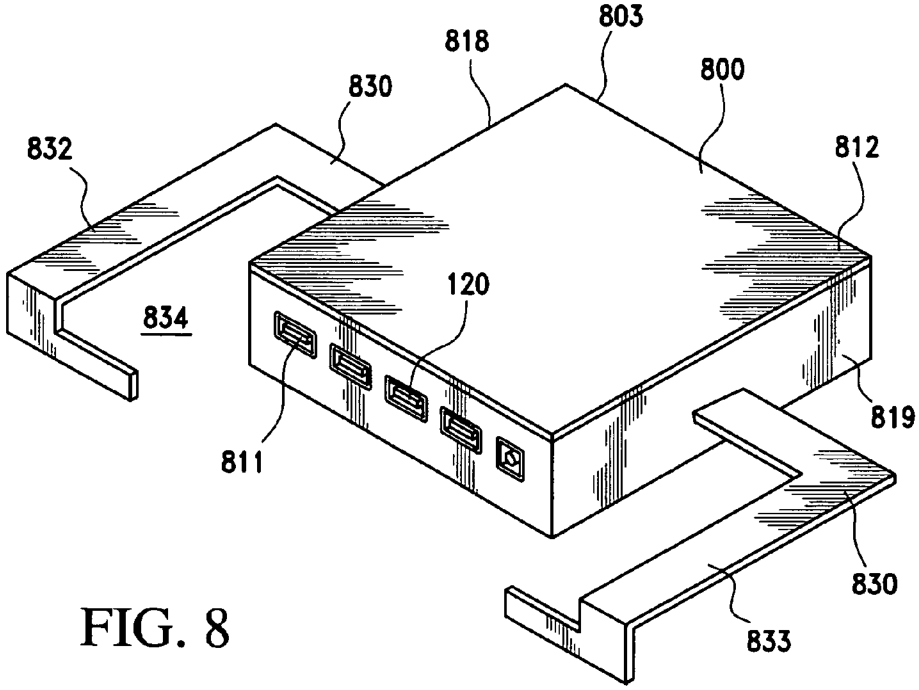
FIG. 8 illustrates a front, right, top isometric view of a sixth electrical device, according to a sixth embodiment.

FIG. 8 illustrates a front, right, top isometric view of an electrical device 800, according to a sixth embodiment. In this embodiment, device 800 includes a body 812 and a stabilization structure 830 adjacent to body 812. Body 812 has a left side 818 and a right side 819 opposite left side 818. Body 812 is substantially similar to body 112 (FIG. 1), except that body 812 includes five apertures 811 instead of the four apertures 111 in body 112 (FIG. 1). Stabilization structure 830 includes support elements 832 and 833. In this embodiment, support elements 832 and 833 are adjacent to and extend from left side 818 and right side 819, respectively. Also in this embodiment, left side 818 and right side 819 do not have any apertures through components 102 are accessible The region between support elements 832 and 833 forms an opening 834 in stabilization structure 830. In one embodiment, body 812 and stabilization structure 830 form a casing 803.

Figure 9:
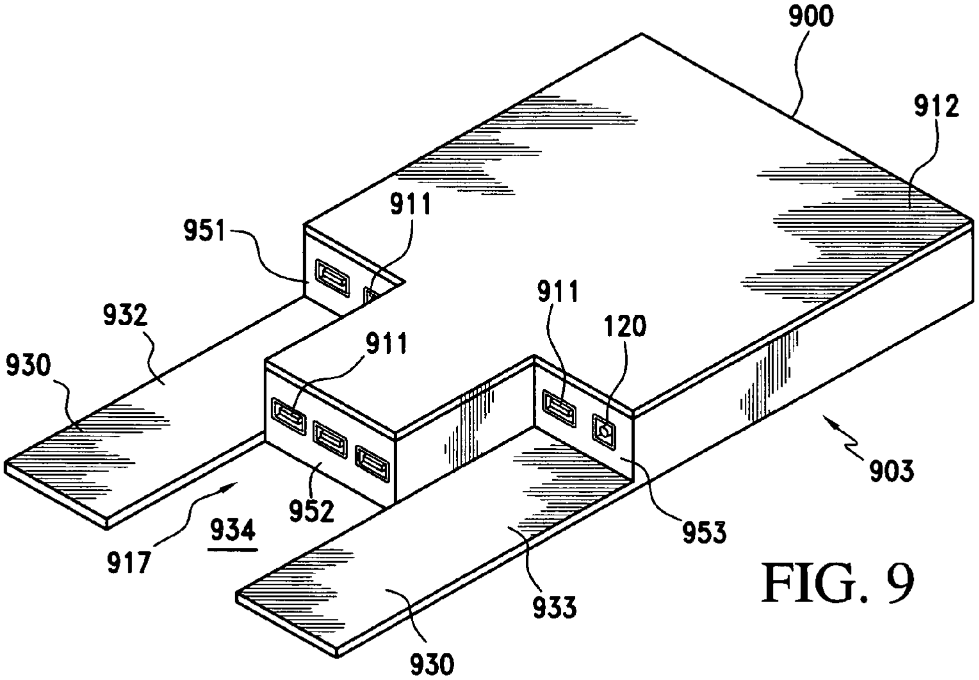
FIG. 9 illustrates a front, right, top isometric view of a seventh electrical device, according to a seventh embodiment.

FIG. 9 illustrates a front, right, top isometric view of an electrical device 900, according to a seventh embodiment. In this embodiment, device 900 includes a body 912 and a stabilization structure 930 adjacent to body 912. Body 912 has a front side 917 with three faces 951, 952, and 953. Faces 951 and 953 each contain two apertures 911, and face 952 contains three apertures 911. In this example, support elements 932 and 933 are adjacent to and extend from faces 951 and 953, respectively. Portions of support element 932 and second support element 933 are separated by an opening 934 in stabilization structure 930. In one example, the width of opening 934 is equal to the width of face 952, which is located between support elements 932 and 933. In one embodiment, body 912 and stabilization structure 930 form a casing 903.

Figure 10:
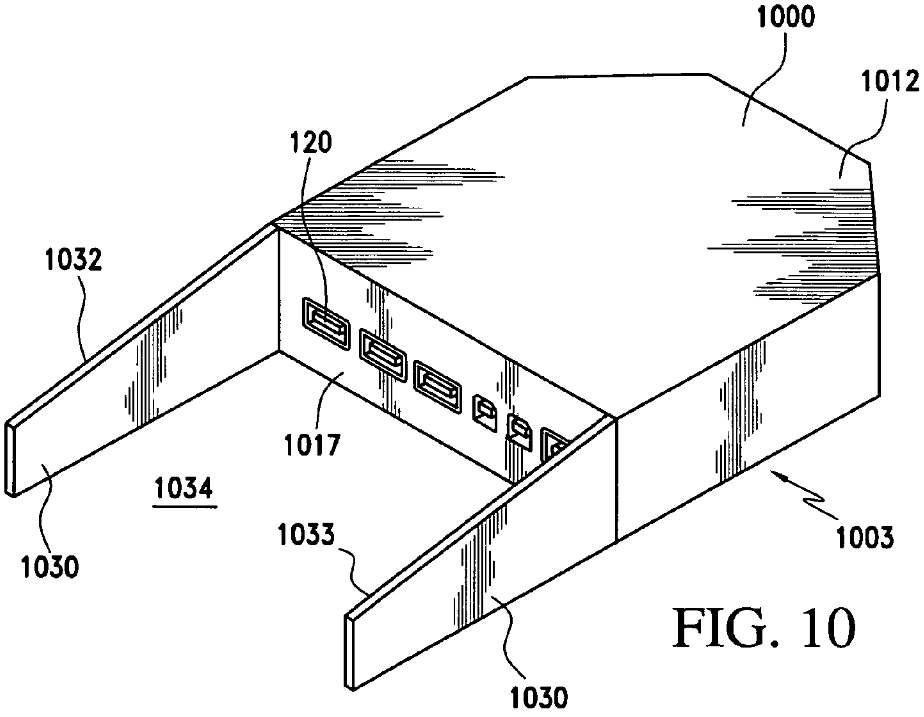
FIG. 10 illustrates a front, right, top isometric view of an eighth electrical device, according to an eighth embodiment.

FIG. 10 illustrates a front, right, top isometric view of an electrical device 1000, according to an eighth embodiment. In this embodiment, device 1000 includes a body 1012 and a stabilization structure 1030 adjacent to body 1012. Body 1012 has a front side 1017. The shape of body 1012 is similar to half of an octagon. Additionally, in this embodiment, stabilization structure 1030 includes two support elements 1032 and 1033. The height of support elements 1032 and 1033 equals the height of front side 1017. The region between support elements 1032 and 1033 forms an opening 1034 in stabilization structure 130. In one embodiment, body 1012 and stabilization structure 1030 form a casing 1003.

Figure 11:
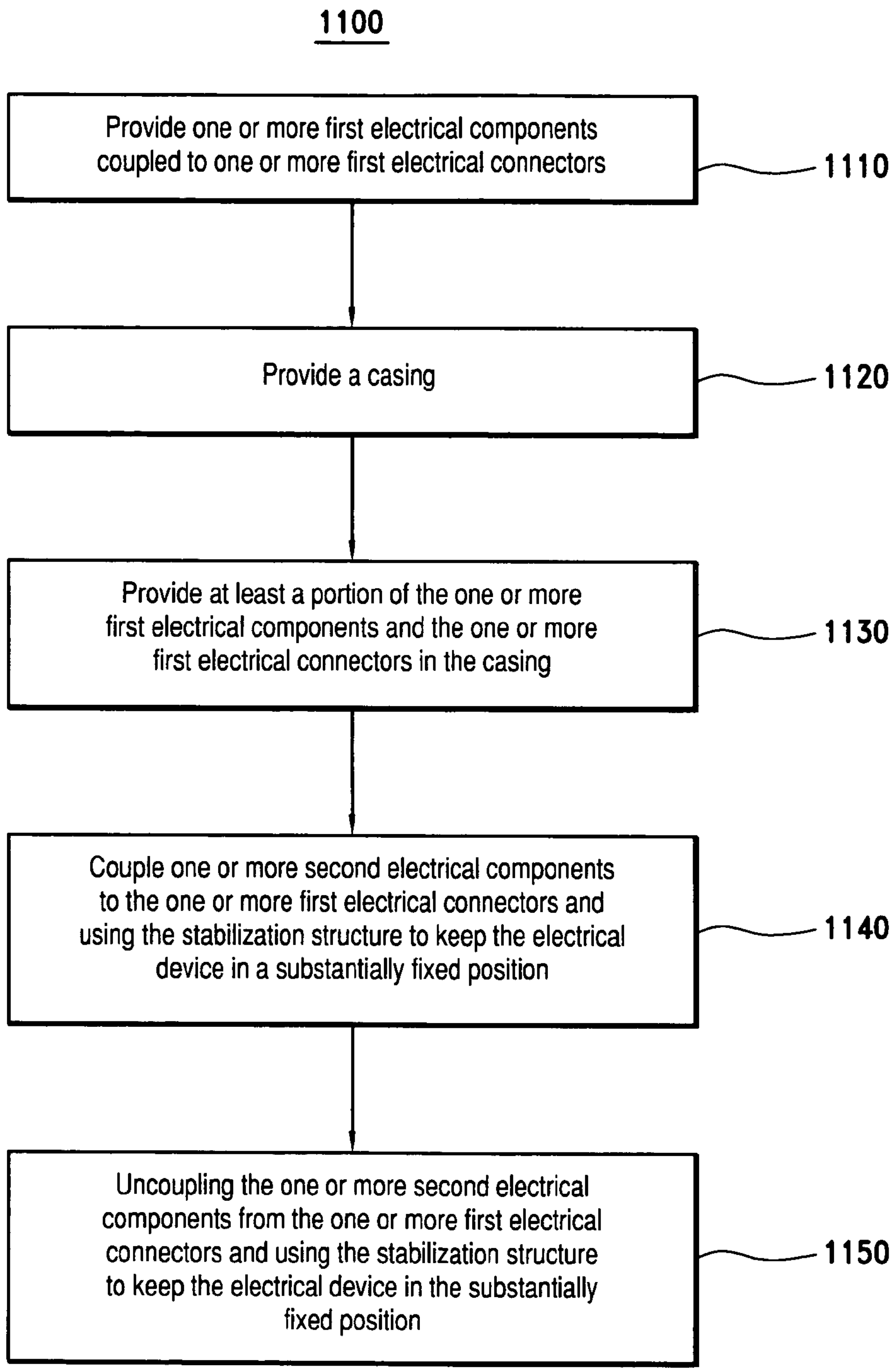
FIG. 11 illustrates a flow chart for a method of forming an electrical device according to another embodiment.

FIG. 11 illustrates a flow chart 1100 for a method of forming an electrical device, according to an embodiment. Flow chart 1100 includes a step 1110 of providing one or more first electrical components. The components are coupled to one or more first electrical connectors. As an example, the first electrical components and the first electrical connectors can be similar to components 102 and electrical connectors 120 of FIG. 1, respectively.

Flow chart 1100 in FIG. 11 continues with a step 1120 of providing a casing. The casing comprises (a) a body having a first side; and (b) a stabilization structure adjacent to the body and having at least one opening. As an example, the casing can be similar to casings 103, 403, 503, 703, 803, 903, and/or 1003 of FIGS. 1, 4-5, and 7-10, respectively. The body can be similar to bodies 112, 412, 512, 712, 812, 912, and/or 1012 of FIGS. 1, 4-5, and 7-10, respectively. The first side can be similar to front sides 117, 417, 917, and/or 1017 of FIGS. 1, 4, 9, and 10, respectively. Likewise, the stabilization structure can be similar to stabilization structures 130, 430, 530, 730, 830, 930, and/or 1030 of FIGS. 1, 4-5, and 7-10, respectively.

In an alternative embodiment, the casing provided in step 1120 can include a body having a front surface. The front surface can have two or more apertures and include: (1) a first end; and (2) a second end opposite the first end. In this embodiment, the casing can further include a stabilization structure extending from the first end and the second end. As an example, the casing can be similar to casings 103, 403, 503, 603, 703, 803, 903, and/or 1003 of FIGS. 1, and 4-10, respectively. The body can be similar to bodies 112, 412, 512, 812, 912, and/or 1012 of FIGS. 1, 4-5, and 8-10, respectively. The first end and the second end can be similar to first end 135 and second end 136 of FIG. 1, respectively. Likewise, the stabilization structure can be similar to stabilization structures 130, 430, 530, 630, 730, 830, 930, and/or 1030 of FIGS. 1 and 4-10, respectively.

Subsequently, flow chart 1100 in FIG. 11 includes a step 1130 of providing at least a portion of the one or more first electrical components and the one or more first electrical connectors in the casing. In this embodiment, the one or more first electrical connectors are accessible at the first side of the body. Also, an example, a user of the electrical device can perform steps 1110, 1120, and 1130 simultaneously with each other by purchasing the electrical device.

In some embodiments, flow chart 1100 in FIG. 11 includes a step 1140 of coupling one or more second electrical components to the one or more first electrical connectors. Step 1140 can also include using the stabilization structure to keep the electrical device in a substantially fixed position while the one or more second electrical components are electrically coupled to the one or more first electrical connectors. In some embodiments, the second electrical components are coupled to the first electrical connectors through second electrical connectors and cables. For example, the second electrical components can be coupled to the first electrical connectors using cables and connectors similar to cable portions 344 and 345 and electrical connectors 341 and 343 of FIG. 3. Additionally, the second electrical components can be coupled more directly to the first electrical connectors, similar to how device 346 is coupled to electrical connector 123 in FIG. 3.

In the same or a different embodiment, flow chart 1100 in FIG. 11 includes a step 1150 of uncoupling the one or more second electrical components from the one or more first electrical connectors. Step 1150 can also include using the stabilization structure to keep the electrical device in the substantially fixed position when one or more second electrical components are electrically uncoupled from the one or more first electrical connectors.

Although the invention has been described with reference to specific embodiments, it will be understood by those skilled in the art that various changes may be made without departing from the spirit or scope of the invention. For example, to one of ordinary skill in the art, it will be readily apparent that the apertures on the body are not necessarily located on the front side. In one example, the apertures can be, at least partially, located on the right, left, and/or top sides and the electrical device can be coupled to second electrical component through these apertures. In another example, the stabilization structure can be called a bracing mechanism, and sides can be referred to as surfaces. Additional examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims.

For example, to one of ordinary skill in the art, it will be readily apparent that the system discussed herein may be implemented in a variety of embodiments, and that the foregoing discussion of certain of these embodiments does not necessarily represent a complete description of all possible embodiments. Rather, the detailed description of the drawings, and the drawings themselves, disclose at least one preferred embodiment of the invention, and may disclose alternative embodiments of the invention.

All elements claimed in any particular claim are essential to the invention claimed in that particular claim. Consequently, replacement of one or more claimed elements constitutes reconstruction and not repair. Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. An electrical device having a first side configured to be supported by a surface, the electrical device comprising:

- a body having the first side comprising a first surface area, a second side comprising a second surface area, and a third side opposite the second side, the third side comprising a third surface area;
- a stabilization structure adjacent to the body and having at least one opening therein; and
- an electrical component located at least partially within the body and having one or more first electrical connectors at the second side;

wherein:

- a distance between the third side and the surface defines a first distance;
- a distance between the second side and the surface defines a second distance;
- the first side is configured such that the first distance is approximately equal to the second distance when the surface supports at least a portion of the stabilization structure and the first side of the electrical device;

the first side and the at least the portion of the stabilization structure are configured such that substantially all of the first side and substantially all of the at least the portion of the stabilization structure contact the surface when the surface supports the at least the portion of the stabilization structure and the first side of the electrical device; and the second surface area and the third surface area are less than the first surface area.

2. The electrical device of claim 1, wherein:

the one or more first electrical connectors are capable of being electrically coupled to one or more second electrical connectors; and the stabilization structure keeps the electrical device in a substantially fixed position relative to the surface while the one or more second electrical connectors are electrically coupled to the one or more first electrical connectors and while the one or more second electrical connectors are uncoupled from the one or more first electrical connectors.

3. The electrical device of claim 1, wherein:

the one or more first electrical connectors are capable of being electrically coupled to one or more second electrical connectors;

the third side is adjacent to the first side; and the stabilization structure prohibits the third side from moving away from the surface when the one or more second electrical connectors are electrically coupled to the one or more first electrical connectors.

4. The electrical device of claim 1, wherein:

the one or more first electrical connectors are capable of being electrically coupled to one or more second electrical connectors;

the third side is adjacent to the first side; and the stabilization structure prevents a substantial change in the first distance relative to the second distance when at least one of the one or more second electrical connectors is coupled to at least one of the one or more first electrical connectors.

5. The electrical device of claim 1, wherein:

the one or more first electrical connectors are capable of being electrically coupled to one or more second electrical connectors;

at least one of the one or more second electrical connectors comprises to a cable portion; and when the at least one of the one or more second electrical connectors are electrically coupled to the one or more first electrical connectors, the cable portion is supported by the stabilization structure.

6. The electrical device of claim 1, wherein:

the stabilization structure is adjacent to the second side of the body.

7. The electrical device of claim 6, wherein:

the second side has a first end and a second end opposite the first end; and the stabilization structure comprises:

a first support bar extending outward from the first end; and a second support bar extending outward from the second end.

8. The electrical device of claim 7, wherein:

the stabilization structure further comprises:

a third support bar extending outward from the second side.

9. The electrical device of claim 7, wherein:

the stabilization structure further comprises:

one or more cross bars coupling the first support bar and the second support bar.

10. The electrical device of claim 9, wherein:

the one or more cross bars comprises two or more cross bars.

11. The electrical device of claim 7, wherein:

at least portions of the first support bar and the second support bar are separated by the at least one opening.

12. The electrical device of claim 7, wherein:

the second side includes at least one aperture located between the first and second support bars; and the one or more first electrical connectors can be electrically coupled to one or more second electrical connectors through the at least one aperture.

13. The electrical device of claim 1, wherein:

the body further comprises:

a fourth side adjacent to the second side and the first side; and a fifth side adjacent to the second side and the first side; and the stabilization structure comprises:

a first support structure extending from the fourth side; and a second support structure extending from the fifth side.

14. The electrical device of claim 1, wherein:

the third side is adjacent to the first side; and a height of the body at the second side is greater than a height of the body at the third side.

15. The electrical device of claim 1, wherein:

the one or more first electrical connectors are capable of being electrically coupled to one or more second electrical connectors; and when at least one of the one or more first electrical connectors is coupled to at least one of the one or more second electrical connectors, a combined center of mass of the electrical device and the at least one of the one or more second electrical connectors remains over a footprint of the electrical device.

16. The electrical device of claim 1, wherein:

the electrical device is a universal serial bus hub; and the one or more first electrical connectors comprise one or more universal serial bus connectors.

17. The electrical device of claim 1, wherein:

at least one of the one or more first electrical connectors is a power supply connector.

18. The electrical device of claim 1, further comprising:

one or more gripping elements coupled to a bottom side of the stabilization structure.

19. An electrical device comprising:

a body having a front surface, a rear surface opposite the front surface, and a bottom surface, wherein:

the front surface comprises:

one or more apertures;

a first end; and a second end opposite the first end; and the bottom surface comprises a surface area;

a bracing mechanism extending from the first end and the second end, the bracing mechanism comprising at least one opening;

two or more first electrical components located at least partially within the body;

two or more first electrical connectors located at least partially within the body and accessible through the one or more apertures; and two or more electrical conductors electrically coupling the two or more first electrical components to the two or more first electrical connectors;

wherein the bottom surface and at least a portion of the bracing mechanism are configured to be supported by a surface such that the bottom surface and the at least the portion of the bracing mechanism contact and remain substantially flush to the surface across substantially all of the surface area of the bottom surface and across substantially all of a surface area of the at least the portion of the bracing mechanism.

20. The electrical device of claim 19, wherein:

the bracing mechanism comprises:

a first support element protruding outward from the first end; and a second support element protruding outward from the second end.

21. The electrical device of claim 20, wherein:

the bracing mechanism further comprises:

a third support element coupling the first support element and the second support element.

22. The electrical device of claim 20, wherein:

portions of the first and second support elements are separated by one or more openings comprising the at least one opening.

23. The electrical device of claim 19, wherein:

the bracing mechanism extends a width of the body.

24. The electrical device of claim 19, wherein:

the two or more first electrical connectors are capable of being electrically coupled to two or more second electrical connectors; and the bracing mechanism prevents the rear surface from becoming elevated above the front surface when at least one of the two or more second electrical connectors are coupled to at least one of the two or more first electrical connectors.

25. A method of providing an electrical device comprising:

providing one or more first electrical components coupled to one or more first electrical connectors;

providing a casing to comprise:

a body having a first side and a second side configured to be supported by a surface; and a stabilization structure adjacent to the body and having at least one opening therein;

providing at least a portion of the one or more first electrical components and the one or more first electrical connectors in the casing such that the one or more first electrical connectors are accessible at the first side; and providing the second side and the stabilization structure such that substantially all of the second side and substantially all of at least a portion of the stabilization structure contact and remain substantially flush to the surface when the surface is supporting the second side.

26. The method of claim 25, further comprising:

coupling one or more second electrical components to the one or more first electrical connectors; and using the stabilization structure to keep the electrical device in a substantially fixed position when the one or more second electrical components are coupled to the one or more first electrical connectors.

27. The method of claim 26 further comprising:

uncoupling the one or more second electrical components from the one or more first electrical connectors; and using the stabilization structure to keep the electrical device in the substantially fixed position when one or more second electrical components are uncoupled from the one or more first electrical connectors.

* * * * *